(12) United States Patent
Chieh et al.

(10) Patent No.: US 9,917,343 B2
(45) Date of Patent: *Mar. 13, 2018

(54) WAVEGUIDE TO COAXIAL LINE TRANSITION HAVING RIGID HOLLOW CONE PORTIONS

(71) Applicant: The United States of America as Represented by the Secretary of the Navy, San Diego, CA (US)

(72) Inventors: Jia-Chi S. Chieh, San Diego, CA (US); Aaron Clawson, San Diego, CA (US); Michael Civerolo, San Diego, CA (US)

(73) Assignee: THE UNITED STATES OF AMERICA AS REPRESENTED BY THE SECRETARY OF THE NAVY, San Diego, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 15/183,571

(22) Filed: Jun. 15, 2016

(65) Prior Publication Data

US 2017/0271737 A1   Sep. 21, 2017

Related U.S. Application Data

(60) Provisional application No. 62/309,392, filed on Mar. 16, 2016.

(51) Int. Cl.
*H01P 5/103* (2006.01)
*H01P 5/08* (2006.01)
(Continued)

(52) U.S. Cl.
CPC .............. *H01P 5/103* (2013.01); *H01P 5/08* (2013.01); *H01P 5/12* (2013.01); *H03F 3/55* (2013.01)

(58) Field of Classification Search
CPC .................................. H01P 5/103; H01P 5/12
(Continued)

(56) References Cited

U.S. PATENT DOCUMENTS 2,891,225 A   6/1959   Lewis et al.
3,182,272 A   5/1965   Borghetti
(Continued)

OTHER PUBLICATIONS

Xiaoyong Shan; Zhongxiang Shen, "A Suspended-Substrate Ku-Band Symmetric Radial Power Combiner," Microwave and Wireless Components Letters, IEEE , vol. 21, No. 12, pp. 652,654, Dec. 2011.

(Continued)

*Primary Examiner* — Benny Lee
(74) *Attorney, Agent, or Firm* — SPAWAR Systems Center Pacific; Kyle Eppele; Ryan Friedl

(57) ABSTRACT

A coaxial to waveguide transition includes a first rigid portion comprising an inverted hollow cone, a second rigid portion comprising a hollow tube, and a third rigid portion comprising a hollow cone. The first rigid portion has a first end and a second end, and tapers inward at a first angle from its first end towards its second end. The second rigid portion has a first end and a second end, with the first end being partially disposed within the second end of the first rigid portion. The third rigid portion has a first end and a second end, with the first end of the third rigid portion being partially disposed within the second end of the second rigid portion. The third rigid portion tapers outward at a second angle from its first end towards its second end, where the second angle is less than the first angle.

19 Claims, 6 Drawing Sheets

(51) Int. Cl.
*H01P 5/12* (2006.01)
*H03F 3/55* (2006.01)

(58) Field of Classification Search
USPC .......................................... 333/26, 125, 137
See application file for complete search history.

(56) References Cited

U.S. PATENT DOCUMENTS

| | | | |
|---|---|---|---|
| 3,725,824 A | | 4/1973 | McDonald |
| 3,728,648 A | * | 4/1973 | Lerner ..................... H01P 1/16 333/137 |
| 3,737,812 A | | 6/1973 | Gaudio et al. |
| 3,942,130 A | | 3/1976 | Harp |
| 3,993,966 A | | 11/1976 | Reindel |
| 4,188,590 A | * | 2/1980 | Harp et al. ................ H01P 5/12 331/101 |
| 4,234,854 A | | 11/1980 | Schellenberg et al. |
| 4,956,614 A | | 9/1990 | Baril |
| 5,214,394 A | | 5/1993 | Wong |
| 5,920,240 A | | 7/1999 | Alexanian et al. |
| 8,928,429 B2 | | 1/2015 | Song et al. |
| 2017/0271740 A1 | * | 9/2017 | Chieh et al. ............. H01P 5/12 |

OTHER PUBLICATIONS

Schellenberg, J.; Watkins, E.; Micovic, M.; Kim, B.; Han, K., "W-band, 5W solid-state power amplifier/combiner," Microwave Symposium Digest (MTT), 2010 IEEE MTT-S International , vol., No., pp. 1,1, May 23-28, 2010.

Denoual, J. M.; Peden, A; Della, B.; Fraysse, J.-P., "16-Way Radial Divider/Combiner for Solid State Power Amplifiers in the K Band," Microwave Conference, 2008. EuMC 2008. 38th European , vol., No., pp. 345,348, Oct. 27-31, 2008.

http://www.microwavejournal.com/articles/6838-spatial-combining-technology-revolutionizing-the-microwave-power-amplifier.

C. Y. Law and A.-V. Pham, "A high-gain 60 GHz power amplifier with 20 dBm output power in 90 nm CMOS," IEEE Int. Solid-State Circuits Dig., pp. 426-427, 2009.

S. Kaijun, F. Yong, and H. Zongrui, "Broadband radial waveguide spatial combiner," IEEE Microw. Wireless Comp. Lett., vol. 18, No. 2, pp. 73-75, Feb. 2008.

D. Yazhou, D. Shi-wei, Z. Zhongbo, and W. Ying, "60 GHz low loss, amplitude and phase balanced radial waveguide power combiner," in Proc. Int. Conf. Electronics, Commun. Control (ICECC), Sep. 2011, pp. 4070-4073.

D. IL. De Villiers, P. W. van der Walt, and P. Meyer, "Design of a ten-way conical transmission line power combiner," IEEE Trans. Microw. Theory Tech., vol. 55, No. 2, pp. 302-308, Feb. 2007.

P. T. Timbie, J. Grade, D. van der Weide, B. Maffei, and G. Pisano, "Stereolithographed MM-wave corrugated horn antennas," in Proc. 36th Int. Conf. Infrared, Millim. Terahertz Waves (IRMMW-THz), Oct. 2011, pp. 1-3.

J.-C. S. Chieh, B. Dick, S. Loui, and J. D. Rockway, "Development of a Ku-band corrugated conical horn using 3-D print technology," IEEE Antennas Wireless Propag. Lett., vol. 13, No. , pp. 201-204, 2014.

C. R. Garcia, R. C. Rumpf, H. H. Tsang, and J. H. Barton, "Effects of extreme surface roughness on 3D printed horn antenna," Electron. Lett., vol. 49, No. 12, pp. 734-736, Jun. 2013.

Yazhou Dong; Shi-wei Dong; Ying Wang, "A 60 GHz solid-state power combining system," Microwave Workshop Series on Millimeter Wave Wireless Technology and Applications (IMWS), 2012 IEEE MTT-S International, vol., No., pp. 1,4, Sep. 18-20, 2012.

* cited by examiner

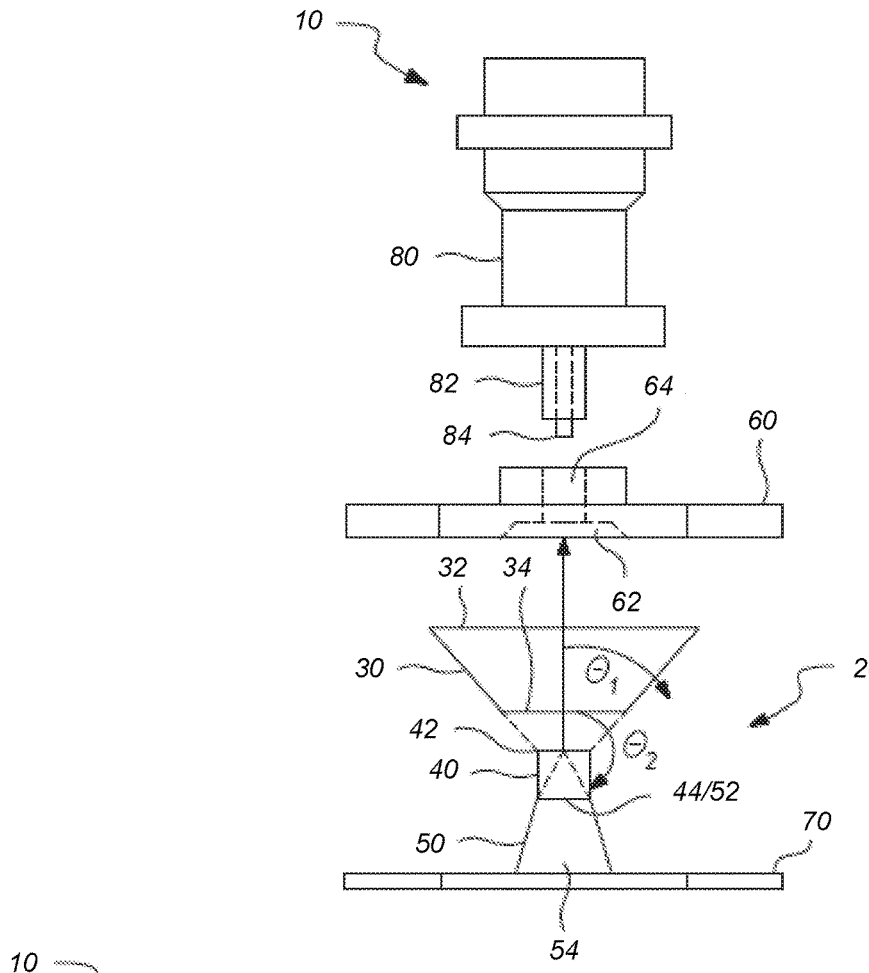
FIG. 1A
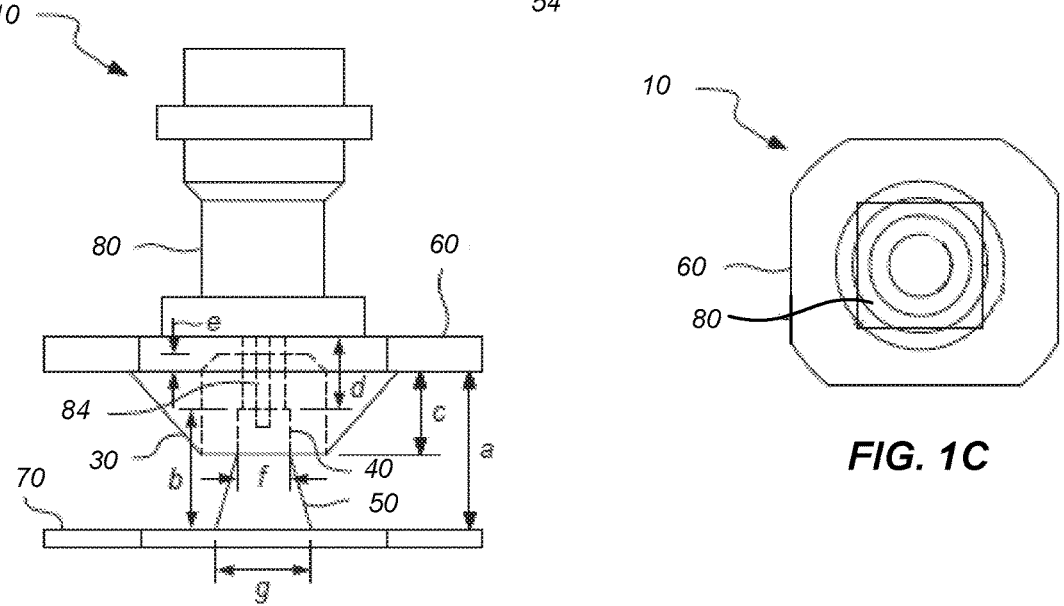
FIG. 1B
FIG. 1C

WAVEGUIDE TO COAXIAL LINE TRANSITION HAVING RIGID HOLLOW CONE PORTIONS

CROSS-REFERENCE TO RELATED APPLICATIONS

This application claims the benefit of U.S. Provisional Patent Application Ser. No. 62/309,392 filed Mar. 16, 2016, entitled "Ultra-Wideband Radial Combiner", the content of which is fully incorporated by reference herein.

FEDERALLY-SPONSORED RESEARCH AND DEVELOPMENT

The Wideband Waveguide to Coaxial Transition is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil; reference Navy Case Number 103526.

BACKGROUND

Many commercial and military technologies require the use of multiple transmission line types, such as coaxial cables, stripline, microstrip, waveguides, and optical fibers. These transmission lines offer different advantages and disadvantages, so it is desirable to transition between two different transmission line technologies within a module or system. Many of these transmission lines transitions tend to only operate efficiently over a narrow frequency band, which greatly reduces the amount of signal spectrum that can flow through them.

In particular, coaxial and waveguide transmission lines are used in a number of electrical modules and systems. A classic example is a waveguide fed antenna (such as a horn) with the waveguide having a signal input from a coaxial cable. This transition consists of the inner conductor of the coaxial line being probed into the waveguide and launching its signal into the waveguide. This transition and other coaxial to waveguide transmission line transitions are used in many applications. Commercially sold or academically documented coaxial-to-waveguide transitions are efficient (low-loss), but very frequency band limited. A need exists for a coaxial to waveguide transmission line transition that operates over a wider frequency band than currently-available transitions and maintains a high level of efficiency.

BRIEF DESCRIPTION OF THE DRAWINGS

FIG. 1A shows an exploded view diagram of an embodiment of a system in accordance with the Wideband Waveguide to Coaxial Transition.

FIG. 1B shows an assembled view of the system shown in FIG. 1A.

FIG. 1C shows a top view of the system shown in FIG. 1A.

DETAILED DESCRIPTION OF SOME EMBODIMENTS

Figure 2:
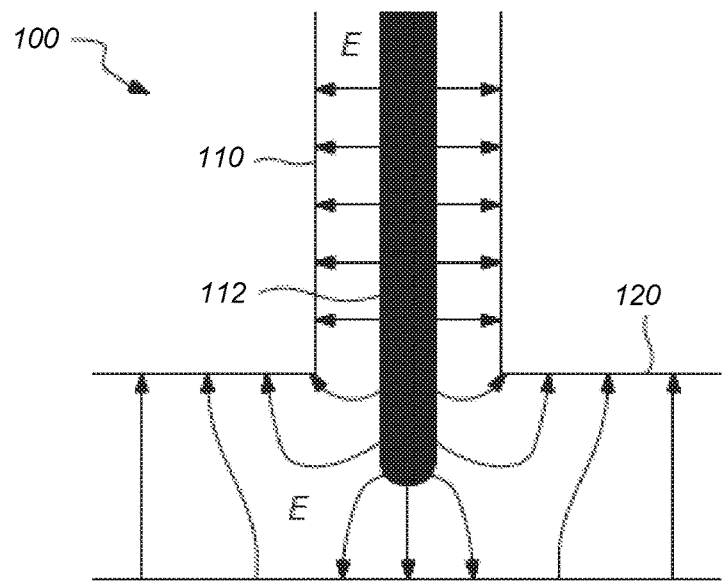
FIG. 2 shows a cross-section diagram of a coaxial cable connected to a waveguide, illustrating the transition of electric field lines of the coaxial conductor into the waveguide without using a transition device.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Further, the terms "around, "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The embodiments disclosed herein involve a means to transition between a waveguide transmission line and coaxial transmission line, or vice versa, using a wideband, efficient transition. The disclosed transition allows for extended frequency operation for high power combination of low power amplifiers using a radial combination method. FIGS. 1A-1C show diagrams of a system 10 including the transition 20 (see FIG. 1A), with FIG. 1A showing an exploded view diagram, FIG. 1B showing an assembled view, and FIG. 1C showing a top view.

Transition 20 includes a first rigid portion 30 comprising an inverted hollow cone, a second rigid portion 40 comprising a hollow tube, and a third rigid portion 50 comprising a hollow cone, as shown in FIGS. 1A and 1B. First rigid portion 30 has a first end 32 and a second end 34 as shown in FIG. 1A. First rigid portion 30 tapers inward at a first angle $\theta_1$ from first end 32 towards second end 34. Second rigid portion 40 has a first end 42 and a second end 44 as shown in FIG. 1A. First end 42 is at least partially disposed within second end 34 of first rigid portion 30. As an example, first end 42 is disposed 1 mm within second end 34, but other depths may be suitable depending upon the application and requirements. Third rigid portion 50 has a first end 52 and a second end 54 as shown in FIG. 1A. First end 52 is at least partially disposed within second end 44 of second rigid portion 40. Third rigid portion 50 tapers outward at a second angle $\theta_2$ from first end 52 towards second end 54.

In some embodiments, the second angle $\theta_2$ is less than the first angle $\theta_1$. In some embodiments, the second angle $\theta_2$ is equal to the first angle $\theta_1$. In some embodiments, the second angle $\theta_2$ is more than the first angle $\theta_1$. As an example, the second angle $\theta_2$ is more than 90 degrees and the first angle $\theta_1$ is less than 90 degrees. In some embodiments, the first angle $\theta_1$ and the second angle $\theta_2$ are determined according to the equation $$Z_c = \frac{1}{2\pi}\sqrt{\frac{\mu}{\epsilon}} \ln\frac{\tan\left(\frac{\theta_2}{2}\right)}{\tan\left(\frac{\theta_1}{2}\right)},$$

where $Z_c$ is the impedance, $\mu$ is permeability of a medium, $\epsilon$ is permittivity of the medium, such as air, $\theta_1$ is the first angle, and $\theta_2$ is the second angle.

The dimensions of the components of transition 20 may vary depending upon the particular application and system requirements. The following dimensions are provided as an illustrative example for a particular configuration. It should be recognized that even with the particular configuration, such dimensions may vary slightly from the numbers given without departing from the intended operation. Accordingly, as shown in FIG. 1B, first rigid portion 30, second rigid portion 40, and third rigid portion 50 may have a combined height of about 11 mm, such that the distance a is 11 mm, the distance b of first end 42 of second rigid portion 40 to the top surface of bottom plate 70 is 7.9 mm, the distance c of second end 44 of second rigid portion 40 to the bottom surface of top plate 60 is 5.25 mm, and the distance d of first end 42 of second rigid portion 40 to the top surface of top plate 60 is 4.7 mm.

Further, as shown in FIG. 1B, the height e of a tapered inset 62 (see FIG. 1) within top plate 60 is 1 mm, the diameter of first end 32 of first rigid portion 30 may be about 12 mm, the diameter of second end 34 of first rigid portion 30 may be about 6.1 mm, the diameter f of first end 42 and second end 44 of second rigid portion 40 may be about 3.5 mm, the diameter of first end 52 of third rigid portion 50 may be about 3.5 mm, and the diameter g of second end 54 of third rigid portion 50 may be about 6.1 mm. These dimensions may be used for wideband operation in the Ku-Band, but the general design as discussed above is applicable at various dimensions for operation in any useable frequency band.

In some embodiments, system 10 further includes a waveguide comprising a top plate 60 and a bottom plate 70 (see FIGS. 1A and 1B). In some embodiments, top plate 60 is separated from bottom plate 70 by a distance of about 10 mm. It should be recognized by a person having ordinary skill in the art that the distance between top plate 60 and bottom plate 70 may vary depending upon the particular application or system requirements.

Figure 4A:
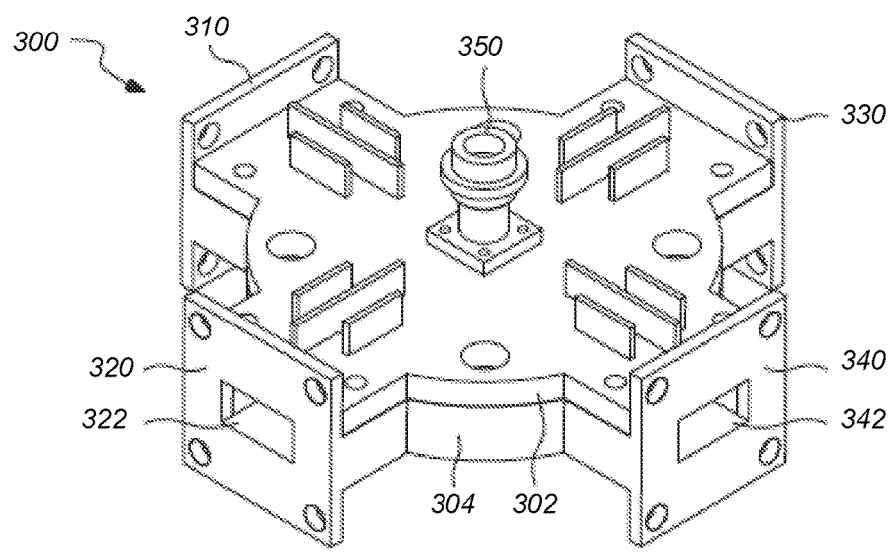
FIG. 4A shows an isometric top down view of an embodiment of a radial combiner system incorporating the Wideband Waveguide to Coaxial Transition.
Figure 4B:
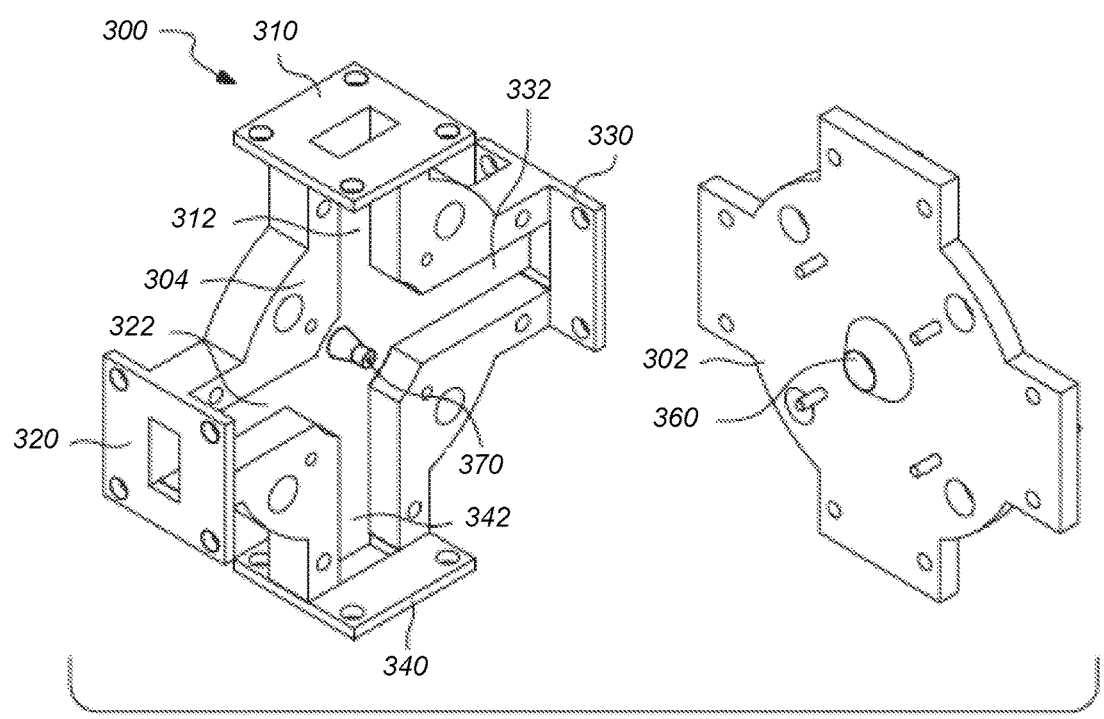
FIG. 4B shows a view of the inside of the system shown in FIG. 4A.

In some embodiments, transition 20 is a stand-alone unit that is incorporated into system 10. In other embodiments, one or more portions of transition 20 are formed as part of another component within system 10. For example, in the stand-alone embodiments, the first end 32 of first rigid portion 30 is in contact with top plate 60. In the other embodiments, first rigid portion 30 is built within the top plate as is shown in FIG. 4B with first rigid portion 360 protruding from top plate 302, and the second rigid portion and third rigid portion (both shown as reference 370) are built within the bottom plate 304. In some embodiments, the second end 54 of third rigid portion 50 is connected to the bottom plate.

Top plate 60 has an opening 64 therein configured to receive a pin 84 (see FIGS. 1A and 1B) of a coaxial connector 80 therethrough. Connector 80 is comprised of a metal pin 84 surrounded by a dielectric (Teflon) bead 82 (see FIG. 1A) to hold pin 84 in place. As an example, pin 84 may have a diameter of 0.91 mm and the coax dielectric bead 82 may have a diameter of 2.94 mm. In some embodiments, top plate 60, first rigid portion 30, second rigid portion 40, and third rigid portion 50 are sized such that when pin 84 of coaxial cable 80 passes through opening 64 (see FIG. 1A), pin 84 becomes electrically connected to third rigid portion 50 has shown for example by pin 212 and third rigid portion 250 in FIG. 3). As shown in FIGS. 1A-1C, an N-type coaxial connector 80 is used. However, the coaxial line could have any coaxial connector.

The design of transition 20 is advantageous in that it increases the frequency bandwidth of commonly used coaxial to waveguide transition by about 28% when compared to a state of the art single top conical taper. Further, it increases the bandwidth of the transition by about 42% when compared to a state of the art single bottom conical taper.

FIG. 2 shows a cross-section diagram 100 of a coaxial cable 110 connected to a waveguide 120, illustrating the transition of electric field lines of the coaxial conductor into the waveguide without using a transition device. In a coaxial line 110, an electric field E exists from the inner conductor 112 to the outer conductor (outer lines representing 110) and is completely contained within the coaxial line 110. When coaxial line 110 transitions to a waveguide 120, the outer coaxial conductor is electrically connected to the waveguide conductive walls and the inner coaxial conductor 112 protrudes in the waveguide cavity, as shown. The electric field E that exists within coaxial line 110 will now propagate in waveguide 120 while being contained between the waveguide walls. The spacing between inner conductor 112 and the walls of waveguide 120 is specifically designed for a particular signal frequency and works efficiently only at a narrow range of frequencies.

Figure 3:
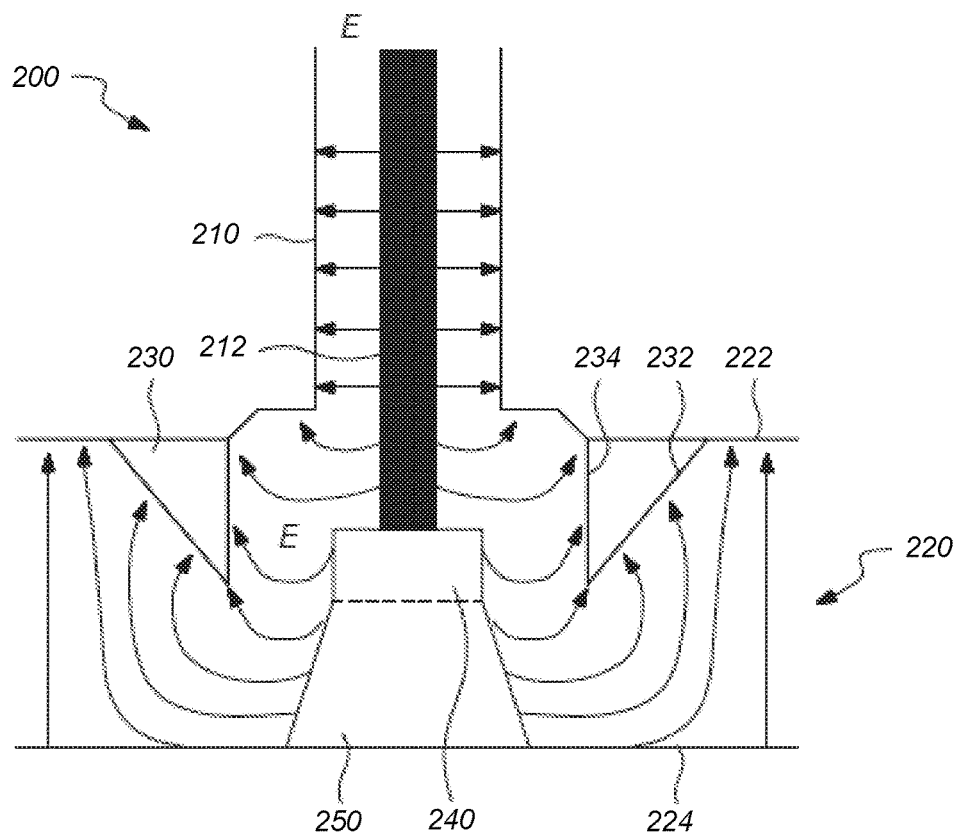
FIG. 3 shows a cross-section diagram of a coaxial cable connected to a waveguide, illustrating the transition of electric field lines of the coaxial conductor into the waveguide using an embodiment of the Wideband Waveguide to Coaxial Transition.

FIG. 3 shows a cross-section diagram 200 of a coaxial cable 210 connected to a waveguide 220, illustrating the transition of electric field E lines of coaxial conductor 212 into waveguide 220 using an embodiment of the Wideband Waveguide to Coaxial Transition. As shown, waveguide 220 is a parallel plate waveguide having a top plate 222 and a bottom plate 224. The transition includes first rigid portion 230, second rigid portion 240, and third rigid portion 250. First rigid portion 230 is configured the same as first rigid portion 30 (shown in FIGS. 1A and 1B), second rigid portion 240 is configured the same as first rigid portion 40 (see FIGS. 1A and 1B), and third rigid portion 250 is configured the same as third rigid portion 50 (see FIGS. 1A and 1B). As shown, first rigid portion 230 has an outer wall 232 and an inner wall 234. Further, a first end of first rigid portion 230 is in contact with top plate 222 and a second end of third rigid portion 250 is connected to bottom plate 224.

As shown, the electric field lines emanating from coaxial conductor 212 within coaxial cable 210 are essentially parallel with waveguide 220. As the electric field E lines transition into the region defined by inner wall 234, the electric field E lines begin to expand out to fill the region, curving significantly beginning where conductor 212 meets second rigid portion 240, but still contained by inner wall 234. Upon reaching third rigid portion 250, the electric field E lines are no longer contained by inner wall 234 and transition outwardly into waveguide 220 between top plate 222 and bottom plate 224. The electric field E lines curve upward and outward from third rigid portion 250 until the electric field E lines eventually become substantially vertical within waveguide 220, as shown.

The conical tapers of the transition, i.e. first rigid portion 230 and third rigid portion 230, allow the transition from the coaxial conductor 210 to waveguide 220 to be performed efficiently at a wide range of frequencies. This occurs because the spacing between the conductors is not one set length, but rather contains the optimal spacing for many different frequencies between the tapered portions.

Figure 4C:
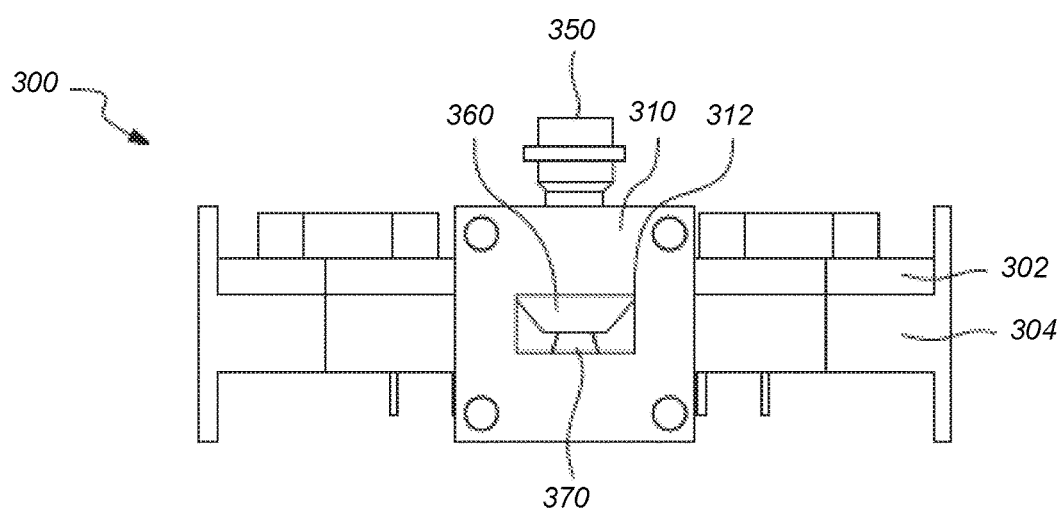
FIG. 4C shows an end view of the system shown in FIG. 4A, illustrating the location of an embodiment of the Wideband Waveguide to Coaxial Transition within the system.

The transition disclosed above may be suitable for many applications and in various devices. One embodiment of the type of device that may utilize the transition is the radial combiner shown in FIGS. 4A-4C. Referring to FIGS. 4A-4C, FIG. 4A shows an isometric top down view of radial combiner 300, FIG. 4B shows a view of the inside of combiner 300, and FIG. 4C shows an end view of combiner 300, illustrating the location of an embodiment of the transition within combiner 300. It should be recognized that combiner 300 may also function as a divider, but the term combiner will be used for illustrative purposes. As shown in FIGS. 4A and 4B, combiner 300 comprises a top plate 302 and a bottom plate 304, defining four waveguide ports 310 (see also FIG. 4C), 320, 330, and 340, each defining waveguides 312 (see FIGS. 4A and 4C), 322 (see FIGS. 4A and 4B), 332 (see FIG. 4B) and 342 (see FIGS. 4A and 4B). An input 350 (see FIGS. 4A and 4C) is coupled to top plate 302 to allow for the connection of a coaxial connector such as connector 80 shown in FIGS. 1A-1C. It should be recognized by one having ordinary skill in the art that the waveguide to coaxial transition disclosed herein may be used in combiners having more or less waveguides than used in combiner 300.

As shown best in FIG. 4B, the transition is formed within combiner 300. More specifically, combiner 300 includes a first rigid portion 360 protruding from top plate 302 towards bottom plate 304, as well as second and third rigid portions, shown as reference 370, protruding from bottom plate 304 towards top plate 302. FIG. 4C shows an end view within waveguide 312 illustrating how the second rigid portion, shown by reference 370, is partially disposed within first rigid portion 360 when combiner 300 is assembled.

Figure 5:
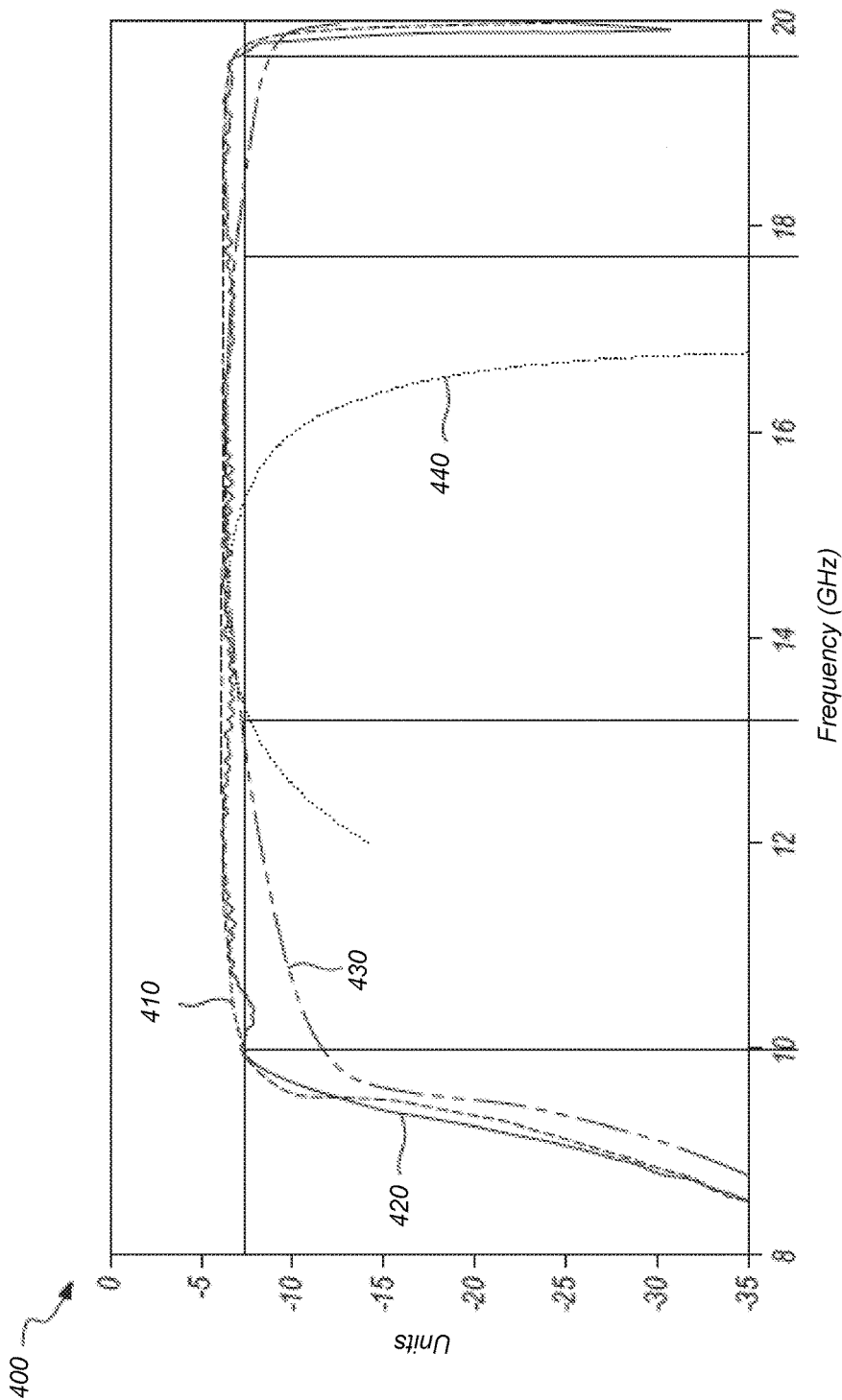
FIG. 5 shows a graph illustrating the simulated and measured insertion loss of the system shown in FIGS. 4A-4C.

One embodiment of the coaxial to waveguide wideband transition disclosed herein was tested in radial combiner 300 as shown in FIGS. 4A-4C. FIG. 5 shows a graph 400 illustrating the simulated and measured insertion loss designated by units vs. frequency in GHz of the transition tested as within combiner 300. As shown, line 410 represents the proposed design simulated insertion loss, line 420 represents the measured insertion loss, line 430 represents a simulated top taper (with no bottom taper) of a separate state-of-the art transition, and line 440 represents a simulated bottom taper (with no top taper) of a separate state-of-the art transition.

The ideal loss for a 4-1 combiner/divider from the N-type threaded input to the rectangular waveguide output arms is 75% loss due to the 1:4 power splitting (6 dB loss). It can be seen from lines 410 and 420 that the transition incorporates nearly zero additional loss over a 2:1 bandwidth (10-20 GHz), which is remarkably wideband. Further, the bandwidth of the two transitions represented by lines 430 and 440 operate over a much narrower frequency range (every 10 units on the y-axis is a factor of 10× loss), indicating the advantages of the embodiments of the transition disclosed herein versus the compared transitions represented by lines 430 and 440.

Figure 6:
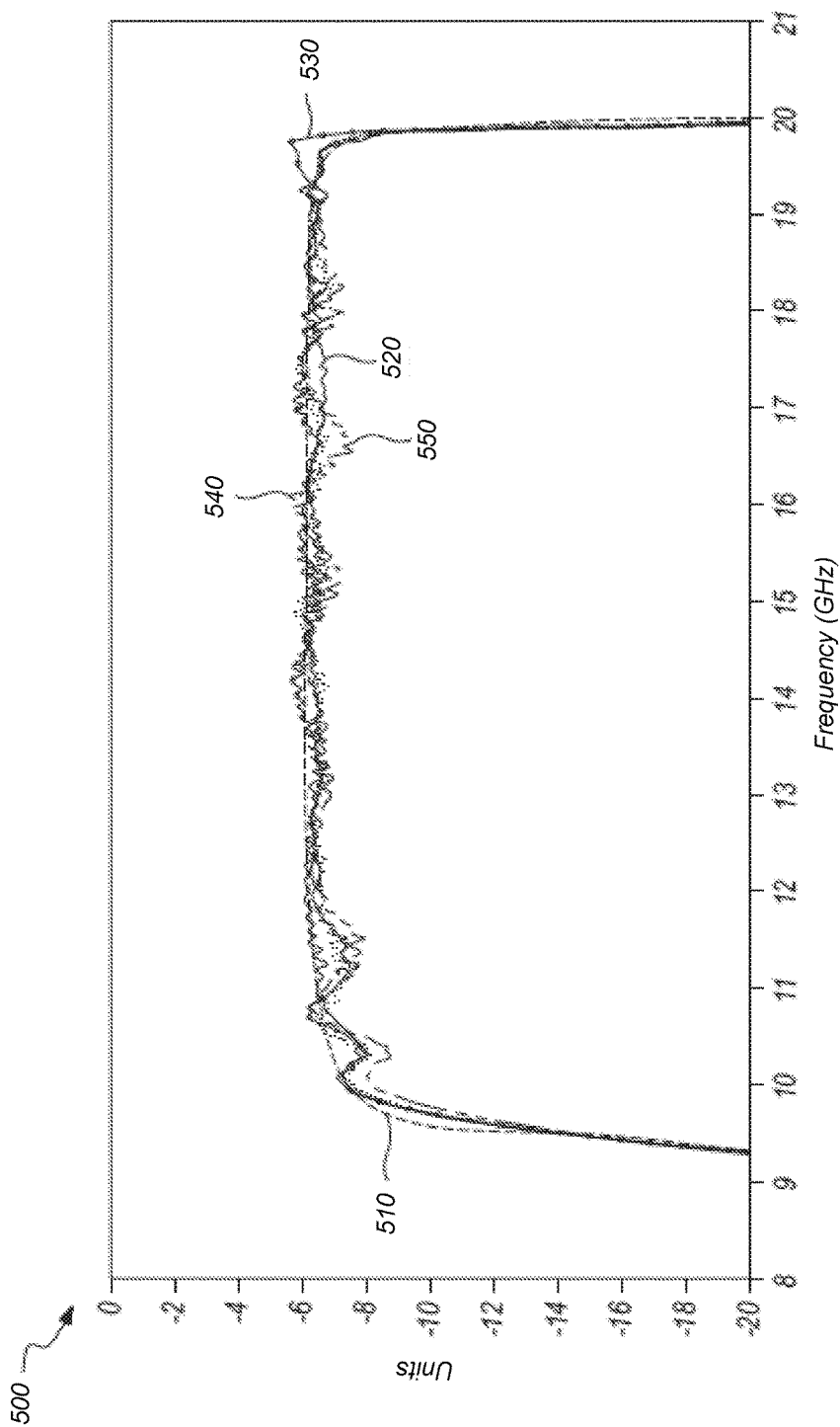
FIG. 6 shows a graph illustrating the simulated and measured insertion loss of all four waveguide ports of the system shown in FIGS. 4A-4C.

FIG. 6 shows a graph 500 illustrating the simulated and measured insertion loss designated by units vs. frequency in GHz of all four waveguide ports of combiner 300 as shown in FIGS. 4A-4C. Graph 500 shows the output at each waveguide port, with line 510 representing the simulated insertion loss, line 520 represents the measured insertion loss of a first port, line 530 represents the measured insertion loss of a second port, line 540 represents the measured insertion loss of a third port, and line 550 represents the measured insertion loss of a fourth port. Graph 500 shows that the transition successfully provides a wideband operation with consistent responses for each waveguide port and a low standard deviation.

Many modifications and variations of the Wideband Waveguide to Coaxial Transition are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:

1. A system comprising:
   a first rigid portion comprising an inverted hollow cone, the first rigid portion having a first end and a second end, wherein the first rigid portion tapers inward at a first angle from the first end towards the second end;
   a second rigid portion comprising a hollow tube, the second rigid portion having a first end and a second end, wherein the first end of the second rigid portion is at least partially disposed within the second end of the first rigid portion; and
   a third rigid portion comprising a hollow cone, the third rigid portion having a first end and a second end, wherein the first end of the third rigid portion is at least partially disposed within the second end of the second rigid portion, wherein the third rigid portion tapers outward at a second angle from the first end towards the second end.

2. The system of claim 1, wherein the first rigid portion, the second rigid portion, and the third rigid portion have a combined height of about 11 mm, the diameter of the first end of the first rigid portion is about 12 mm, the diameter of the second end of the first rigid portion is about 6.1 mm, the diameter of the first end of the third rigid portion is about 3.5 mm, and the diameter of the second end of the third rigid portion is about 6.1 mm.

3. The system of claim 1 further comprising a waveguide having a top plate and a bottom plate, wherein the first end of the first rigid portion is in contact with the top plate.

4. The system of claim 3, wherein the second end of the third rigid portion is connected to the bottom plate.

5. The system of claim 3, wherein the top plate has an opening therein configured to receive a pin of a coaxial cable therethrough.

6. The system of claim 5, wherein the top plate, the first rigid portion, the second rigid portion, and the third rigid portion are sized such that when the pin of the coaxial cable passes through the opening, the pin becomes electrically connected to the third rigid portion.

7. The system of claim 3, wherein the top plate is separated from the bottom plate by a distance of about 10 mm.

8. The system of claim 1, wherein the first angle and the second angle are determined according to the equation $$Z_c = \frac{1}{2\pi}\sqrt{\frac{\mu}{\epsilon}} \ln \frac{\tan\left(\frac{\theta_2}{2}\right)}{\tan\left(\frac{\theta_1}{2}\right)},$$

where $Z_c$ is the impedance, $\mu$ is permeability of a medium, $\in$ is permittivity of the medium, $\theta_1$ is the first angle, and $\theta_2$ is the second angle.

9. The system of claim 1, wherein the first angle is less than 90 degrees and the second angle is greater than 90 degrees.

10. A system comprising:
   a first rigid portion comprising an inverted hollow cone, the first rigid portion having a first end and a second end, wherein the first rigid portion tapers inward at a first angle from the first end towards the second end;
   a second rigid portion comprising a hollow tube, the second rigid portion having a first end and a second end, wherein the first end of the second rigid portion is at least partially disposed within the second end of the first rigid portion;
   a third rigid portion comprising a hollow cone, the third rigid portion having a first end and a second end, wherein the first end of the third rigid portion is at least partially disposed within the second end of the second rigid portion, wherein the third rigid portion tapers outward at a second angle from the first end towards the second end; and
   a waveguide having a top plate and a bottom plate, wherein the first end of the first rigid portion is in contact with the top plate, wherein the second end of the third rigid portion is connected to the bottom plate, wherein the top plate has an opening therein configured to receive a pin of a coaxial cable therethrough.

11. The system of claim 10, wherein the first rigid portion, the second rigid portion, and the third rigid portion have a combined height of about 11 mm, the diameter of the first end of the first rigid portion is about 12 mm, the diameter of the second end of the first rigid portion is about 6.1 mm, the diameter of the first end of the third rigid portion is about 3.5 mm, and the diameter of the second end of the third rigid portion is about 6.1 mm.

12. The system of claim 10, wherein the top plate, the first rigid portion, the second rigid portion, and the third rigid portion are sized such that when the pin of the coaxial cable passes through the opening, the pin becomes electrically connected to the third rigid portion.

13. The system of claim 10, wherein the first angle and the second angle are determined according to the equation $$Z_c = \frac{1}{2\pi}\sqrt{\frac{\mu}{\epsilon}} \ln \frac{\tan\left(\frac{\theta_2}{2}\right)}{\tan\left(\frac{\theta_1}{2}\right)},$$

where $Z_c$ is the impedance, $\mu$ is permeability of a medium, $\in$ is permittivity of the medium, $\theta_1$ is the first angle, and $\theta_2$ is the second angle.

14. The system of claim 10, wherein the first angle is less than 90 degrees and the second angle is greater than 90 degrees.

15. The system of claim 10, wherein the top plate is separated from the bottom plate by a distance of about 10 mm.

16. A system comprising:
   a first rigid portion comprising an inverted hollow cone, the first rigid portion having a first end and a second end, wherein the first rigid portion tapers inward at a first angle from the first end towards the second end;
   a second rigid portion comprising a hollow tube, the second rigid portion having a first end and a second end, wherein the first end of the second rigid portion is at least partially disposed within the second end of the first rigid portion;
   a third rigid portion comprising a hollow cone, the third rigid portion having a first end and a second end, wherein the first end of the third rigid portion is at least partially disposed within the second end of the second rigid portion, wherein the third rigid portion tapers outward at a second angle from the first end towards the second end, wherein the first angle and the second angle are determined according to the equation $$Z_c = \frac{1}{2\pi}\sqrt{\frac{\mu}{\epsilon}} \ln \frac{\tan\left(\frac{\theta_2}{2}\right)}{\tan\left(\frac{\theta_1}{2}\right)},$$

where $Z_c$ is the impedance, $\mu$ is permeability of a medium, $\in$ is permittivity of the medium, $\theta_1$ is the first angle, and $\theta_2$ is the second angle; and
   a radial waveguide having a top plate and a bottom plate, wherein the first end of the first rigid portion is in contact with the top plate, wherein the second end of the third rigid portion is connected to the bottom plate, wherein the top plate has an opening therein configured to receive a pin of a coaxial cable therethrough, wherein the top plate, the first rigid portion, the second rigid portion, and the third rigid portion are sized such that when the pin of the coaxial cable passes through the opening, the pin becomes electrically connected to the third rigid portion.

17. The system of claim 16, wherein the first rigid portion, the second rigid portion, and the third rigid portion have a combined height of about 11 mm, the diameter of the first end of the first rigid portion is about 12 mm, the diameter of the second end of the first rigid portion is about 6.1 mm, the diameter of the first end of the third rigid portion is about 3.5 mm, and the diameter of the second end of the third rigid portion is about 6.1 mm.

18. The system of claim 16, wherein the first angle is less than 90 degrees and the second angle is greater than 90 degrees.

19. The system of claim 16, wherein the top plate is separated from the bottom plate by a distance of about 10 mm.

\* \* \* \* \*